US005358901A

United States Patent [19]
Fiordalice et al.

[11] Patent Number: 5,358,901
[45] Date of Patent: Oct. 25, 1994

[54] PROCESS FOR FORMING AN INTERMETALLIC LAYER

[75] Inventors: Robert W. Fiordalice, Austin; Stanley M. Filipiak, Pflugerville; Johnson O. Olowolafe; Hisao Kawasaki, both of Austin, all of Tex.

[73] Assignee: Motorola, Inc., Schaumburg, Ill.

[21] Appl. No.: 24,042

[22] Filed: Mar. 1, 1993

[51] Int. Cl.[5] .............................. H01L 21/44
[52] U.S. Cl. ................... 437/192; 437/194; 437/245; 437/246
[58] Field of Search ............... 437/192, 194, 245, 246

[56] References Cited

U.S. PATENT DOCUMENTS

| | | | |
|---|---|---|---|
| 4,619,038 | 10/1986 | Pintchovski | 29/590 |
| 4,698,244 | 10/1987 | Benander et al. | 427/253 |
| 5,225,372 | 7/1993 | Savkar | 437/190 |

FOREIGN PATENT DOCUMENTS 420594  9/1990  European Pat. Off. .

OTHER PUBLICATIONS

Beach, "Chemical Vapor Deposition of Aluminum from Trimethylamine-Alane" J. Vac. Sci. Technol. A, vol. 7, No. 5, Sep./Oct. 1989.
Howard, et al.; "Intermetallic Compounds of Al and Transitions Metals: Effect of Electromigration in 1-2-μm-Wide Lines"; J. Appl. Phys.; vol. 49, No. 7, pp. 4083–4093 (1978).
Lee, et al.; "Roles of Ti–Intermetallic Compound Layers on the Electromigration Resistance of Al–Cu Interconnecting Stripes"; J. Appl. Phys.; vol. 71, No. 12, pp. 5877–5887 (Jun. 15, 1992).
Rodbell, et al.; "Electromigration Behavior In Layered Ti/AlCu/Ti Films And Its Dependence On Intermetallic Structure"; Mat. Res. Soc. Symp. Proc.; vol. 225; pp. 91–97 (1991).
Towner; "The Importance of the Short–Circuit Failure Mode in Aluminum Electromigration"; J. Vac. Sci. Technol.; vol. B5, No. 6, pp. 1696–1700 (1987).
Outlaw, et al.; "Titanium Aluminides: Surface Compositon Effects As A Function Of Temperature"; NASA Langley Research Center; vol. 24, pp. 171–176 (1990).

Primary Examiner—Robert Kunemund
Assistant Examiner—Joni Y. Chang
Attorney, Agent, or Firm—George R. Meyer

[57] ABSTRACT

The present invention includes a process for forming an intermetallic layer and a device formed by the process. The process includes a reaction step where a metal-containing layer reacts with a metal-containing gas, wherein the metals of the layer and gas are different. In one embodiment of the present invention, titanium aluminide may be formed on the sides of an interconnect. The process may be performed in a variety of equipment, such as a furnace, a rapid thermal processor, a plasma etcher, and a sputter deposition machine. The reaction to form the intermetallic layer is typically performed while the substrate is at a temperature no more than 700 degrees Celsius.

36 Claims, 3 Drawing Sheets

PROCESS FOR FORMING AN INTERMETALLIC LAYER

FIELD OF THE INVENTION

The present invention relates to the field of semiconductor devices, and in particular, to processes for forming an intermetallic by reacting a metal with a gas and devices formed by the process.

BACKGROUND OF THE INVENTION

An intermetallic material is a material that comprises a plurality of metallic elements. Intermetallic materials, in which one of the metallic elements is a refractory metal, are used in the aviation and aerospace industries. Refractory-metal intermetallics are sometimes used in aircraft parts because of their light weight and durability compared to other metals. In the aviation and aerospace industry, refractory-metal intermetallics are usually formed at temperatures of at least 800 degrees Celsius. Such a high temperature of formation is unacceptable for the semiconductor industry. The intermetallics are usually part of a contact, interconnect, or via and are formed relatively late in a semiconductor process flow (after a silicide layer or doped regions, such as emitter or source/drain regions, have been formed). Heating a substrate to a temperature higher than about 700 degrees Celsius is generally undesired.

Within the semiconductor industry, intermetallic materials are being investigated to examine their ability to reduce electromigration and oxidation of metals within contacts or interconnects. An example of an intermetallic used in the semiconductor industry is titanium aluminide ($TiAl_3$). Titanium aluminide may be formed by sputtering or evaporating a layer of aluminum, sputtering or evaporating a layer of titanium, and reacting the layers to form titanium aluminide. This method of forming titanium aluminide is actually a type of solid—solid reaction because one solid reacts with another solid.

Although the solid—solid reaction that forms titanium aluminide is typically performed at a temperature less than 700 degrees Celsius, the process suffers from several detriments. As used in this specification, intermetallic step coverage is defined as the thickness of the intermetallic layer at its thinnest point along the side of a patterned metal layer divided by the thickness of the intermetallic layer formed on the top of the patterned metal layer. The intermetallic step coverage is expressed as a percentage. Using the solid—solid reaction that forms titanium aluminide, the intermetallic step coverage is typically no more than 10 percent and may even reach 0 percent in which case, the titanium aluminide is not formed along all of the sides of the aluminum layer. Electromigration, oxidation, and hillock formation may not be sufficiently reduced in a lateral direction because of the lower intermetallic step coverage. The unreacted titanium may: 1) form undesired electrical connections because of etch complications, 2) have undesired reactions before forming or with subsequently formed layers that contact the unreacted titanium, or 3) complicated a subsequent patterning step during the formation of interconnects.

SUMMARY OF THE INVENTION

The present invention includes a process for forming an intermetallic layer by reacting a metal layer over a substrate with a metal-containing gas, wherein the metals in the layer and the gas are different. The present invention also includes a device formed using the process. In one embodiment, a titanium aluminide layer is formed by reacting an aluminum-containing layer with titanium tetrachloride, which is a gas during the reaction. The gas allows the titanium aluminide layer to be formed on exposed sidewalls of a patterned aluminum-containing layer. Different embodiments of the invention may use a furnace, a rapid thermal processor, a plasma etcher, or a sputter deposition machine for a reactor. An embodiment of the present invention forms an intermetallic layer formed while the substrate is at a temperature no higher than 700 degrees Celsius during the reaction.

Other features and advantages of the present invention will be apparent from the accompanying drawings and from the detailed description that follows.

BRIEF DESCRIPTION OF THE DRAWINGS

The present invention is illustrated by way of example and not limitation in the figures of the accompanying drawings, in which like references indicate similar elements, and in which.

DETAILED DESCRIPTION OF THE EMBODIMENTS

The present invention includes a process for forming an intermetallic layer by reacting a metal layer over a substrate with a metal-containing gas, wherein the metals in the layer and the gas are different. The present invention also includes a device formed using the process. Embodiments of the invention describe the use of the invention in a furnace, a rapid thermal processor, a plasma etcher, or a sputter deposition machine. The intermetallic layer is typically formed while the substrate is at a temperature no higher than 700 degrees Celsius. Two examples are described immediately below. Benefits, fabricating options, and general reactions are described later in the specification.

EXAMPLE 1

Figure 1:
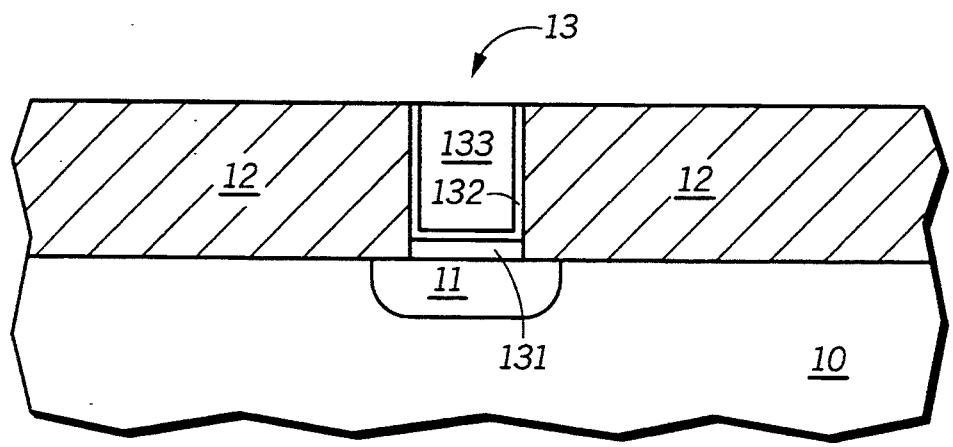
FIGS. 1-3 each include cross-sectional views of a portion of a substrate at various process steps in forming a titanium aluminide layer in accordance with one embodiment of the present invention.
Figure 2:
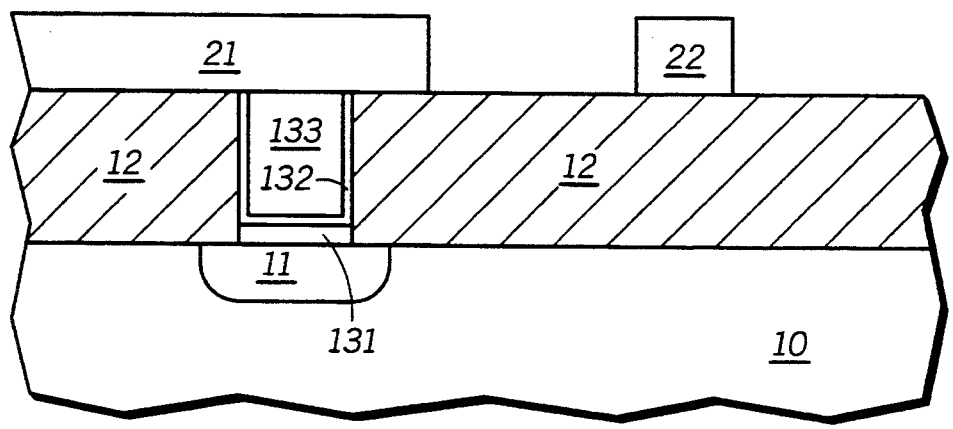

FIG. 1 includes a cross-sectional view of a semiconductor substrate prior to forming an interconnect. A doped region 11 lies within a silicon substrate 10. A patterned insulating layer 12 lies over the substrate and includes a contact plug 13 to the doped region 11. The contact plug 13 includes a titanium silicide layer 131, a titanium nitride layer 132, and a tungsten layer 133. A metal layer is deposited on the insulating layer 12 and the contact plug 13 by a sputter deposition process. The metal layer is about 98 weight percent aluminum with about 1 weight percent silicon and about 1 weight percent copper. The metal layer is patterned to form interconnects 21 and 22 as shown in FIG. 2.

Figure 3:
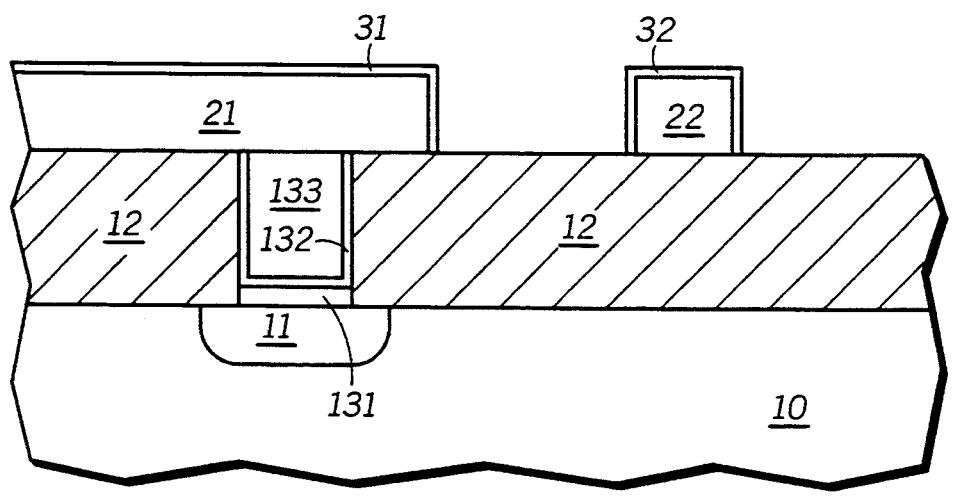

The substrate including the interconnects 21 and 22 are placed into a rapid thermal processor (RTP). The RTP is pumped down to evacuate the reaction chamber of the RTP. After being pumped down, the temperature of the reaction chamber is adjusted to about 375 degrees Celsius. The substrate becomes about the same temperature as the reaction chamber prior to performing the reaction. Gases including titanium tetrachloride ($TiCl_4$) at about 10 standard cubic centimeters per minute (SCCM), hydrogen ($H_2$) at about 100 SCCM, and argon (Ar) at about 20 SCCM are introduced into the reaction chamber, and the reaction chamber pressure is adjusted to about 150 millitorr. The substrate is allowed to react with the gas at the pressure for about 45 seconds. The reaction forms titanium aluminide ($TiAl_3$) layers 31 and 32 that are each about 225 angstroms thick and are shown in FIG. 3. Aluminum chloride ($AlCl_3$) is also a product of the reaction and is a gas during the reaction. After the substrate is removed from the RTP, only the titanium aluminide layers 31 and 32 that are formed along the sides of the interconnects 31 and 32 contact the insulating layer 12. Virtually no unreacted titanium is formed on the insulating layer 12. The reactor is purged with a relatively inert gas, such as nitrogen, argon, and the like, the reactor temperature is lowered, and the pressure is allowed to reach about atmospheric pressure. The substrate is then removed from the RTP.

EXAMPLE 2

Figure 4:
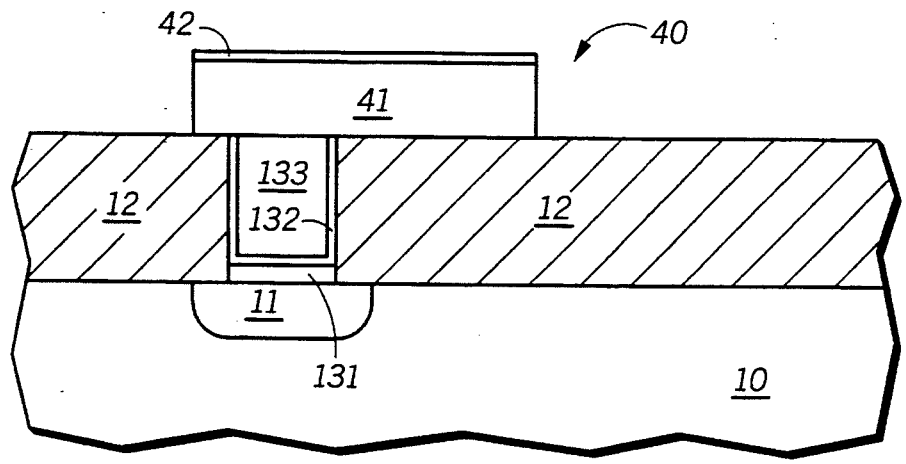
FIGS. 4-8 each include cross-sectional views of a portion of a substrate at various process steps in forming a titanium aluminide layer in accordance with another embodiment of tile present invention.

In another embodiment, the titanium aluminide layer may be formed from a portion of an aluminum layer that lies at the bottom of a via opening. As shown in FIG. 4, a doped region 11 lies within a substrate 10. A patterned insulating layer 12 includes an opening with a contact plug, which includes a titanium silicide layer 131, a titanium nitride layer 132, and a tungsten layer 133. After forming the contact plug, a first metal layer 41, which includes about 98 weight percent aluminum, about 1 weight percent silicon, and about 1 weight percent copper, is deposited over the patterned insulating layer 12 and the contact plug. A titanium nitride layer 42 is deposited on the first metal layer 41. The first metal and titanium nitride layers 41 and 42 are patterned to form a first-level interconnect 40 as shown in FIG. 4.

Figure 5:
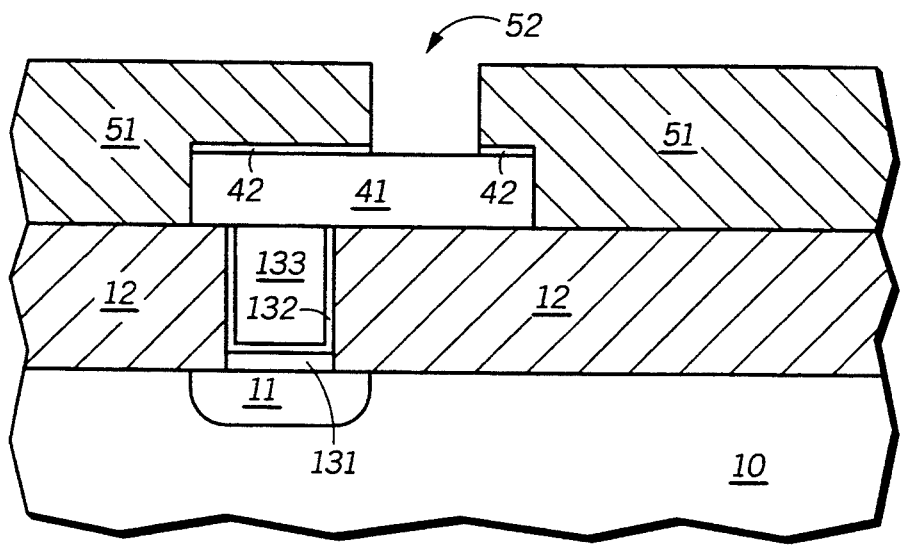

A patterned interlevel dielectric (ILD) layer 51 is formed by depositing and etching a dielectric layer. The patterned ILD layer 51 includes a via opening 52. Although the titanium nitride layer 42 should act as an etch stop during the formation of the via opening 52, some or all of the titanium nitride layer 42 is etched. FIG. 5 includes an illustration in which all of the titanium nitride layer 42 along the bottom the via opening 52 has been removed by the etch that forms the via opening 52. The metal layer 41 that lies at the bottom of the via opening 52 is exposed and may be attacked by chemicals. The first-level interconnect 40 is more susceptible to electromigration if a capping layer is not formed on the first metal layer 41.

Figure 6:
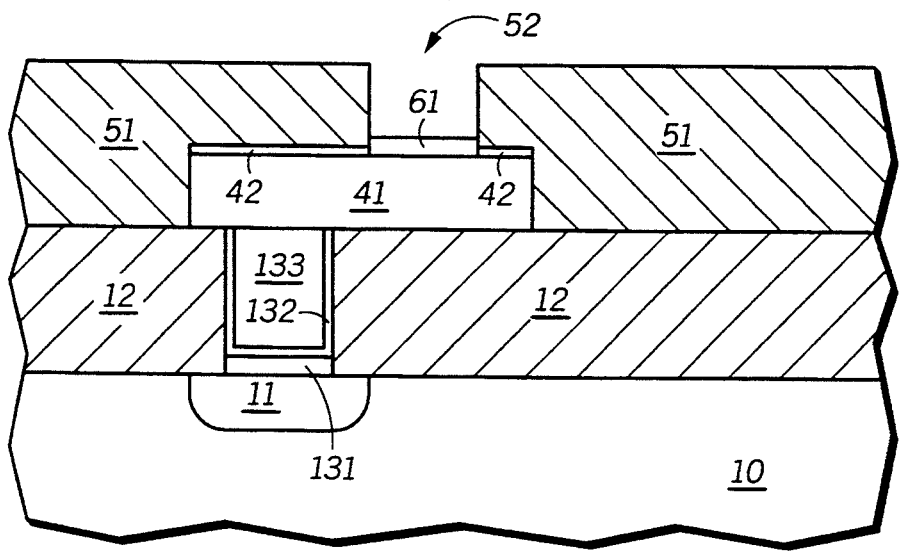

Referring to FIG. 6, the substrate including the exposed first metal layer 41 at the bottom of the via opening 52 is placed into an RTP to form a titanium aluminide layer 61 from a portion of the aluminum within the first metal layer 41 that lies at the bottom of the via opening 52. The titanium aluminide is formed at about the same conditions as listed in the embodiment of Example 1. After the substrate is removed from the RTP, the titanium aluminide layer 61 is formed only along the bottom of the via opening 52 and does not contact the ILD layer 51 except near the bottom of the via opening 52. Virtually no unreacted titanium is formed on the ILD layer 51.

Figure 7:
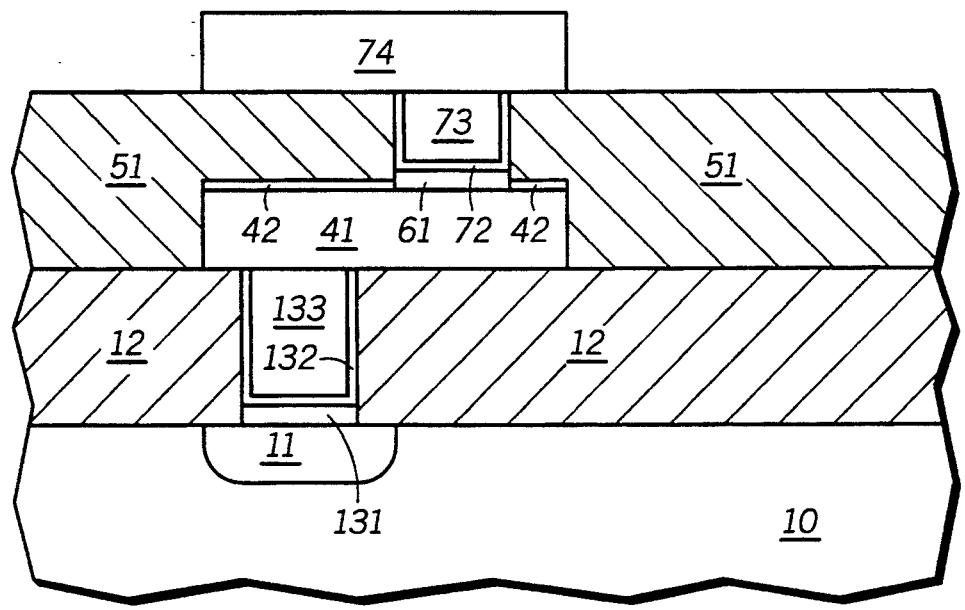
Figure 8:
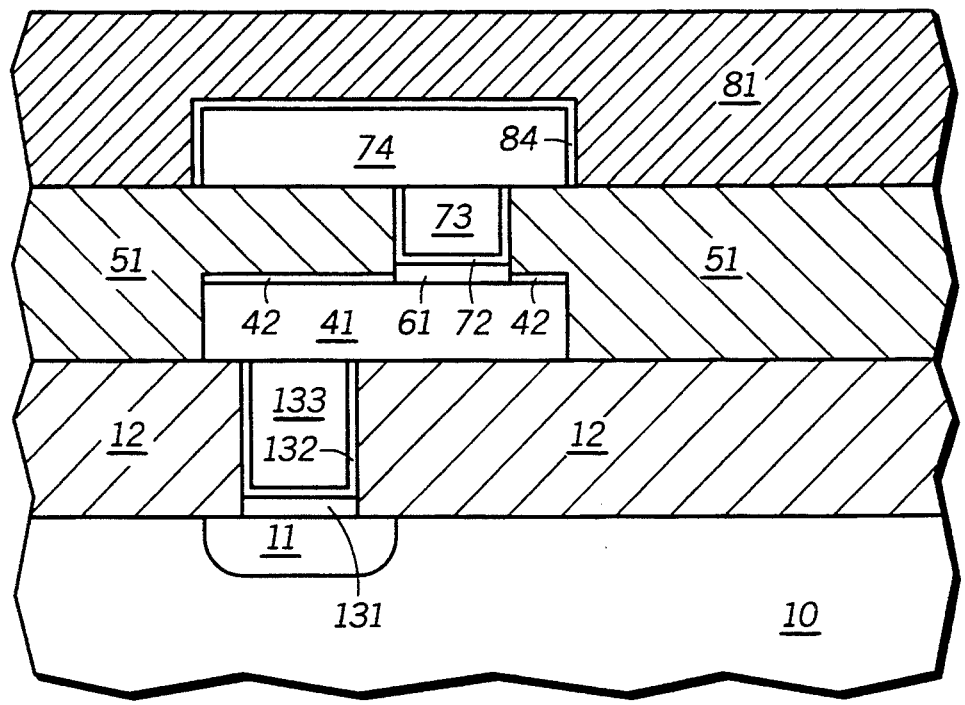

FIG. 7 includes a cross-sectional view of the semiconductor substrate after forming a second-level interconnect. The via opening 52 is filled to form a via plug. The via plug includes the previously described titanium aluminide layer 61. The via plug further includes a titanium nitride layer 72 and a tungsten layer 73. The formation of the titanium nitride and tungsten layers 72 and 73 within the via opening 52 is performed using a conventional process. A second metal layer, which includes 98 weight percent aluminum, about 1 weight percent silicon, and about 1 weight percent copper, is deposited on the ILD layer 51 and the via plug. The second metal layer is patterned to form the second-level interconnect 74 as shown in FIG. 7. Referring to FIG. 8, the substrate is placed in an RTP and exposed to an ambient including titanium tetrachloride to form a titanium aluminide layer 84 on the second-level interconnect 74. The reaction conditions are the same as those used in the embodiment of Example 1. A passivation layer 81 is formed over the titanium aluminide layer 84 and the ILD layer 51 to form a substantially completed device.

Benefits and Fabrication Options of the Examples

The embodiments described above includes many benefits. Titanium aluminide helps to reduce electromigration and is more oxidation resistant compared to aluminum, titanium, and other titanium-containing compounds. The titanium aluminide is formed by reacting gaseous titanium tetrachloride with aluminum in the interconnect without sputtering or evaporating titanium. Therefore, titanium aluminide is formed on all exposed surfaces of the interconnect, which includes the sides. The intermetallic step coverage may be about 100 percent with the embodiments. As will be described later, the titanium aluminide may be formed using a plasma method. Although the plasma method may have lower intermetallic step coverage compared to the embodiments of the examples, the intermetallic step coverage is typically at least 50 percent. Hillocks may be formed in a vertical or a lateral direction. The ability to form titanium aluminide with at least 50 percent intermetallic step coverage reduces the likelihood of forming lateral hillocks compared to the solid—solid reaction that forms titanium aluminide.

The embodiments of the Examples do not form an unreacted titanium layer. The solid—solid reaction that forms titanium aluminide may have unreacted titanium remaining after the reaction. Any unreacted titanium from the solid—solid reaction that forms titanium aluminide typically needs to be removed after the reaction to form titanium aluminide. Removal of the unreacted titanium must be selected to both aluminum and titanium aluminide. Many etchants that etch titanium also etch aluminum. There is also a risk that the etchants that etch titanium also may etch titanium aluminide.

If unreacted titanium were not removed, the unreacted titanium may cause problems. The volume of aluminum and titanium before reaction is more than the volume of titanium aluminide formed by the reaction. Consider the following situation. Layers of aluminum and titanium are deposited and patterned to form an interconnect. In this example, the solid—solid reaction between the layers occurs, but not all of the aluminum and titanium layers are consumed by the solid—solid reaction. An insulating layer is placed over the interconnect. Subsequent thermal cycles may cause the unreacted titanium to further react with the aluminum layer. Because the volume of the titanium aluminide formed by the reaction is less than the volume of titanium and aluminum used in forming the titanium aluminide, the interconnect effectively shrinks in size thereby forming a void between the interconnect and the insulating layer. Aluminum layers typically have tensile stress. The presence of a void may allow the aluminum layer to peel away from the substrate, which is undesirable.

The unreacted titanium may cause other problems. If the titanium-sputter method was used to form titanium aluminide within the via opening 52 of FIG. 5, unreacted titanium probably would lie on the ILD layer 51 and on the titanium aluminide that is formed at the bottom of the via opening 52. If the unreacted titanium that lies on the titanium aluminide within the via opening 52 is not removed, the unreacted titanium may react with oxygen or air to form a titanium-oxide material, which is generally undesired. The resistance within the via plug may be too high. In addition, the unreacted titanium may react with subsequently formed layers. Therefore, the unreacted titanium may: 1) form undesired electrical connections because of etch complications, 2) have undesired reactions before forming or with subsequently formed layers that contact the unreacted titanium, or 3) complicated a subsequent patterning step during the formation of interconnects. The method of the present invention does not have the detriments of the solid—solid reaction that forms titanium aluminide. The titanium of the titanium chloride reacts with the aluminum of the interconnect, and does not form unreacted titanium over the substrate. Therefore, complications that arise due to unreacted titanium do not exist with the present invention.

Another benefit of the present invention is the variety of equipment and processing conditions that may be used to form the titanium aluminide. The reaction to form titanium aluminide may be performed in a furnace, an RTP, sputter deposition machine, or etching equipment. Specific applications using these types of equipment are described later. Tile aluminum source is typically a metal layer that usually has at least 95 percent aluminum and/or small amounts of silicon or copper. The metal layer may include an amount of aluminum, which is less than 95 percent. The titanium source should be a gas during the reaction with aluminum, and a compound within the gas includes titanium and typically chlorine atoms. Titanium sources may include titanium tetrachloride, titanium-chloride-halide compounds, or organotitanium compounds that have chlorine radicals. If the titanium source does not have any chlorine atoms, a chlorine-containing gas, such as molecular chlorine ($Cl_2$) may be added. The gas may consist of the titanium source or further include a non-oxidizing diluent. The non-oxidizing diluent may be hydrogen, argon, helium, nitrogen, or chlorine. When the gas includes a diluent, the titanium source usually comprises no more than about 25 volume percent of the total gas composition.

The pressure of the reaction chamber during the reaction is no higher than about atmospheric pressure. The highest pressure that may be used may depend on the titanium source. Titanium tetrachloride is a liquid at atmospheric pressure. Therefore, the reaction chamber must be under a vacuum when using titanium tetrachloride. For most applications, the pressure during reaction is no higher than about 500 millitorr. The actual flow rates of the titanium source and/or diluent depends on the reactor chamber pressure and volume. The flow rates typically are larger for higher pressures or larger volumes. The actual gas flows listed in the embodiment of Example 1 are illustrative and not limiting.

The substrate temperature during the reaction to form titanium aluminide is usually no higher than about 550 degrees Celsius. For most applications, the substrate temperature is no higher than 450 degrees Celsius. The reaction time depends on the temperature, pressure, and gas composition. Reaction times are addressed below with regards to specific applications. The thickness of the titanium aluminide formed in the embodiment of Example 1 is about 225 angstroms. The thickness of titanium aluminide using the method of the present invention has no known limits, and a titanium aluminide layer between about 2600–3000 angstroms has been formed. For most applications, the thickness of the titanium aluminide is enough to achieve a desired resistance to electromigration or oxidation and is usually no thicker than 1000 angstroms.

Applications with Various Pieces of Equipment

The embodiments of the Examples were performed using an RTP. In general, the reaction chamber when using the RTP is usually 300–450 degrees Celsius, and the reaction time is between 10–300 seconds. The substrate has about the same temperature as the reaction chamber of the RTP during the reaction. A furnace may be used for the reaction, but the furnace must be able to be evacuated to remove oxidizing species. An example of such a furnace is a chemical vapor deposition furnace that is used to deposit films, such as silicon dioxide, polysilicon, or silicon nitride. The furnace may be a single-wafer processor or a batch processor. For a single-wafer processor, the reaction conditions for the RTP may be used. Most batch processor types of furnaces are not able to perform a controlled reaction for a time in a range of 10-300 second. The batch processor types of furnace may have reaction times up to 30 minutes. For example, a batch processor type of furnace may operate with a reaction chamber temperature of about 200 degrees Celsius. The substrates are at about the same temperature as the reaction chamber. The reaction time can be adjusted to about 10 minutes at about 200 degrees Celsius by adjusting the reaction chamber pressure and the gas composition of the reaction chamber. Lower pressures and less titanium source concentration within the gas usually causes the reaction time to increase for a constant temperature.

Titanium aluminide may be formed using a plasma, which is an ionized gas. A plasma reaction may be used to form titanium aluminide. The temperature of the substrate should be about the same as it is for the RTP or furnace reaction. In an RTP or furnace, the temperature of the substrate is about the same as the reaction chamber itself. In a plasma reactor, the substrate may be placed on a susceptor that is maintained at a different temperature compared to the plasma. The substrate temperature should be adjusted to be at about the same temperature as listed above with respect to an RTP or furnace. The plasma reaction should occur at a faster rate compared to an RTP or furnace reaction performed at the same temperature. The parameters of the plasma may need to be adjusted, so that the titanium aluminide forms on both top and side surfaces of an exposed interconnect. Higher reactor pressure and lower power may be used to form titanium aluminide along the sides of an interconnect. If the titanium aluminide is not to be formed on the sides of an interconnect, the plasma does not need this type of adjusting. Equipment capable of forming a plasma include furnaces, plasma etchers, and sputter deposition machines. A plasma-enhanced deposition furnace is an example of one type of furnace that may be used.

Complications may occur with a plasma etcher, but the complications are not insurmountable. In the embodiments of the examples, patterning steps may be performed using photoresist masks. A hard mask may be used to allow the titanium aluminide reaction to occur without exposing an aluminum-containing interconnect to oxygen or air. For example, consider forming titanium aluminide on an interconnect that lies at the bottom of a via opening. After an interconnect is formed, a relatively thick silicon dioxide layer and a relatively thin silicon nitride layer are sequentially deposited over the interconnect. A photoresist mask is formed on the silicon nitride layer and includes a photoresist opening within the photoresist mask that lies over the interconnect. A silicon nitride layer opening is etched through the silicon nitride layer and the photoresist mask is removed. The silicon dioxide layer opening is etched using the silicon nitride layer as a hard mask. The silicon dioxide layer is etched in a plasma etcher to form a silicon dioxide layer opening that extends through the silicon dioxide layer to the interconnect. The combination of the silicon dioxide layer opening and the silicon nitride layer opening form a via opening. A titanium aluminide layer is formed from a portion of the aluminum in the interconnect at the bottom of the via opening after the via opening is formed and before the interconnect at the bottom of the via opening is exposed to oxygen, air, or atmospheric pressure.

A sputter deposition machine may also be used for the formation of titanium aluminide. Many types of sputter deposition machines have a plurality of chambers, which can be heated to temperatures of at least 450 degrees Celsius. A substrate is placed into the machine, and the substrate is placed under a vacuum. A metal layer including aluminum is deposited over a substrate in a first chamber using a conventional sputter deposition method. After depositing the metal layer, the substrate is moved to a second chamber without exposing the metal layer to oxygen, air, or atmospheric pressure. The reaction to form titanium aluminide is performed in the second chamber. The reaction may occur at conditions similar to those used for an RTP if the chamber can be heated, or the reaction may be a plasma reaction, wherein the plasma is directed at the substrate instead of a sputtering target.

General Reactions

Although much of the specification has focused on titanium aluminide, the present invention is not limited to titanium aluminide. The general reaction equation for the formation of the intermetallics in accordance with an embodiment of the present invention and the titanium aluminide reaction of the embodiment of Example 1 are as follows:

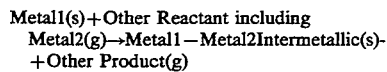

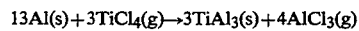

The phases (solids and gases) listed are the phases of the reactants and products during the reaction itself. As can be seen, the reaction to form the Metal 1-Metal 2 Intermetallic (titanium aluminide) is a type of solid-gas reaction, as opposed to a solid—solid reaction that may occur with deposition methods that include sputtering, evaporating, or chemical vapor depositing (CVD). The reaction does not form an unreacted Metal 2 solid on the Metal 1 or the Metal 1-Metal 2 Intermetallic. In the case of the embodiments described above, unreacted titanium is not formed on the aluminum layer or the titanium aluminide layer. In the reaction, the Metal 1 (aluminum) and the Metal 1-Metal 2 Intermetallic (titanium aluminide) are the only solids. The other reactant (titanium tetrachloride) and product (aluminum chloride) are gases during the reaction. Although the singular form of other reactant or other product is used, a plurality of other reactants may be used, or a plurality of other products may be formed. Because the other reactants and other product are gases, the unreacted portion of the other reactant and the other product may be easily removed. If diluents are used, they should also be gases during the reaction. A separate process step to remove unreacted reactants, which typically occurs with a sputter deposition process, is not needed. In addition, because the other reactant and product are not liquids or solids, particle and contamination problems are typically reduced compared to a sputter deposition process. The reaction typically occurs at the surface of a metal and not on insulating or dielectric layers. Therefore, the intermetallic may be formed in a self-aligned manner without the need for a separate patterning step.

Metal 1 can be any metal. In many semiconductor applications, metal 1 is copper or aluminum. The layer of Metal 1 may include small amounts of impurities. The other reactant includes Metal 2. Usually, the other reactant includes a metal halide or an organometallic compound. Because many metals etch with chlorine, the other reactant typically includes a metal chloride, a metal-chlorine halide or an organometallic compound with a chlorine radical that is attached to a metal atom. If the Metal 2 gas does not include any chlorine atoms, a chlorine-containing gas may be added, such as molecular chlorine. In semiconductor applications, the other reactant normally includes a transition element, and more specifically, a refractory metal, such at titanium, tungsten, tantalum, molybdenum, cobalt, and the like. In the embodiments of the Example 1, Metal 1 is aluminum and the other reactant is titanium tetrachloride. The selection of the other reactant may in part be determined by the Metal 1 and the fact that the other product needs to be a gas. In the embodiment of Example 1, the other reactant is titanium tetrachloride which reacts with the aluminum to form for aluminum trichloride ($AlCl_3$), which is a gas during the reaction (at the reacting conditions). Although specific materials are listed above with respect to Metal 1 and the other reactant, the specific materials listed are to be illustrative and not limiting.

The substrate should be at a temperature no higher than 700 degrees Celsius during the reaction. Above 700 degrees Celsius, undesired complications may arise. Above 550 degrees Celsius, a barrier layer typically degrades in performance (as a barrier layer) and is generally not desired. In the embodiment of Example 1, the substrate will normally be at a temperature no higher than 450 degrees Celsius during the reaction. Therefore, the reaction in the embodiment of Example 1 should not have the problems discussed within this paragraph.

In the foregoing specification, the invention has been described with reference to specific embodiments thereof. It will, however, be evident that various modifications and can be made thereto without departing from the broader spirit or scope of the invention as set forth in the appended claims. The specification and drawings are, accordingly, to be regarded in an illustrative rather than a restrictive sense.

What is claimed is:

1. A process for forming an intermetallic layer over a semiconductor substrate comprising the steps of:
   forming a first layer over the substrate, wherein the first layer is a solid and includes a first metal that has first metal atoms; and
   reacting the first layer with a gas to form products including the intermetallic layer and a gaseous product, wherein:
      the gas includes a second metal that has second metal atoms, which are different from the first metal atoms;
      the intermetallic layer includes intermetallic molecules that include the first and second metals atoms;
      all of the first metal atoms in the intermetallic layer are supplied by the first layer and all of the second metal atoms in the intermetallic layer are supplied by the gas; and
      the substrate is at a temperature no higher than 700 degrees Celsius during the step of reacting.

2. The process of claim 1, wherein:
   the step of reacting forms products consisting of the intermetallic layer and at least one other product;
   the other product is a gas during the step of reacting;
   the intermetallic layer is a solid; and
   the step of reacting occurs as a solid-gas reaction.

3. The process of claim 1, wherein:
   the first metal is aluminum and the first layer includes at least 95 percent aluminum;
   the intermetallic layer includes titanium aluminide and the second metal is titanium;
   the substrate is at a temperature no higher than 550 degrees Celsius during the step of reacting;
   the step of reacting is performed in a piece of equipment selected from a group consisting of a rapid thermal processor, a plasma etcher, and a sputter deposition machine;
   the step of reacting is performed at a pressure no higher than atmospheric pressure; and
   the gas includes a titanium source and a diluent selected from a group consisting of hydrogen, argon, nitrogen, helium, and chlorine.

4. The process of claim 3, wherein:
   the step of reacting is performed:
      in a rapid thermal processor;
      at a pressure less than 500 millitorr;
      while the substrate is at a temperature in a range of 300–450 degrees Celsius; and
      for a time between 30–60 seconds;
   the titanium source is titanium tetrachloride and comprises less than 25 percent of the gas; and
   the intermetallic layer has a thickness no thicker than 1000 angstroms.

5. A process for forming an intermetallic layer including titanium aluminide over a semiconductor substrate comprising the steps of:
   forming an aluminum-containing layer over the substrate, wherein the aluminum-containing layer is a solid; and
   reacting the aluminum-containing layer with a gas to form the intermetallic layer, wherein the gas includes a titanium source, and wherein all of the aluminum in the titanium aluminide is supplied by the aluminum-containing layer and all of the titanium in the titanium aluminide is supplied by the gas.

6. The process of claim 5, wherein the step of reacting is performed in a piece of equipment selected from a group consisting of a rapid thermal processor, a plasma etcher, and a sputter deposition machine.

7. The process of claim 5, wherein the aluminum-containing layer includes at least 95 percent aluminum.

8. The process of claim 5, wherein:
   the step of reacting is performed at a temperature no higher than 550 degrees Celsius;
   the step of reacting is performed at a pressure no higher than atmospheric pressure; and
   the gas further includes a diluent selected from a group consisting of hydrogen, argon, nitrogen, helium, and chlorine; and
   the step of reacting occurs as a solid-gas reaction.

9. The process of claim 8, wherein the titanium source is a material selected from a group consisting of titanium tetrachloride, a titanium-halide compound, and an organotitanium compound.

10. The process of claim 9, wherein:
    the step of reacting is performed:
       in a rapid thermal processor;
       at a pressure no higher than 500 millitorr;
       while the substrate is at a temperature in a range of 300–450 degrees Celsius; and
       for a time between 30–60 seconds;
    the titanium source is titanium tetrachloride and comprises less than 25 volume percent of the gas; and
    the intermetallic layer has a thickness no thicker than 1000 angstroms.

11. A process for forming an intermetallic layer including titanium aluminide over a semiconductor substrate comprising the steps of:
    depositing an aluminum-containing layer over a first insulating layer, wherein:
       the aluminum-containing layer includes at least 95 weight percent aluminum and an impurity selected from a group consisting of silicon and copper; and
       the first insulating layer lies over the substrate;
    patterning the aluminum-containing layer to form an interconnect;
    reacting the interconnect with a gas to form the intermetallic layer, wherein:
       the ambient includes titanium tetrachloride and a diluent selected from a group consisting of hydrogen, argon, helium, and nitrogen;
       wherein all of the aluminum in the titanium aluminide is supplied by the aluminum-containing layer and all of the titanium in the titanium aluminide is supplied by the gas;
       the step of reacting is performed at a pressure no higher than about atmospheric pressure;
       the substrate is at a temperature no higher than 550 degrees Celsius during the step of reacting; and
       the step of reacting occurs as a solid-gas reaction.

12. The process of claim 11, wherein:
    the step of reacting is performed:
       in a rapid thermal processor;
       at a pressure no higher than 500 millitorr;
       while the substrate is at a temperature in a range of 300–450 degrees Celsius; and
       for a time between 30–60 seconds;

the titanium tetrachloride comprises no more than 25 volume percent of the gas; and the intermetallic layer has a thickness no thicker than 1000 angstroms.

13. The process of claim 1, further comprising a step of patterning the first layer to form sides prior to the step of reacting.

14. The process of claim 1, further comprising a step of forming a patterned insulating layer over the layer including the first metal, wherein:
the patterned insulating layer includes an opening;
a portion of the layer including the first metal is exposed and underlies the opening;
the step of forming the patterned insulating layer is performed prior to the step of reacting; and
the step of reacting forms the intermetallic layer from the exposed portion of the layer including the first metal.

15. The process of claim 5, further comprising a step of patterning the aluminum-containing layer to form sides prior to the step of reacting.

16. The process of claim 5, further comprising a step of forming a patterned insulating layer over the aluminum-containing layer, wherein:
the patterned insulating layer includes an opening;
a portion of the aluminum-containing layer is exposed and underlies the opening; and
the step of forming the patterned insulating layer is performed prior to the step of reacting; and
the step of reacting forms the intermetallic layer from the exposed portion of the aluminum-containing layer.

17. A process for forming a titanium aluminide layer over a semiconductor substrate comprising the steps of:
forming an aluminum-containing interconnect over the substrate, wherein the aluminum-containing interconnect includes at least 95 weight percent aluminum and an impurity selected from a group consisting of silicon and copper;
forming a patterned insulating layer, wherein:
the patterned insulating layer includes an opening;
a portion of the aluminum-containing interconnect is exposed and underlies the opening; and
reacting the exposed portion of the aluminum-containing interconnect with a gas to form the titanium aluminide layer, wherein:
the ambient includes titanium tetrachloride and a diluent selected from a group consisting of hydrogen, argon, helium, and nitrogen;
the step of reacting is performed at a pressure no higher than about atmospheric pressure;
the substrate is at a temperature no higher than 550 degrees Celsius: during the step of reacting; and
the step of reacting occurs as a solid-gas reaction.

18. The process of claim 17, wherein:
the step of reacting is performed:
in a rapid thermal processor;
at a pressure no higher than 500 millitorr;
while the substrate is at a temperature in a range of 300–450 degrees Celsius; and
for a time between 30–60 seconds;
the titanium tetrachloride comprises no more than 25 volume percent of the gas; and
the titanium aluminide layer has a thickness no thicker than 1000 angstroms.

19. A process for forming an intermetallic layer over a semiconductor substrate comprising the steps of:
forming a layer over the substrate, wherein the layer includes at least 95 percent aluminum; and
reacting the layer with a gas at a pressure less than 500 millitorr in a rapid thermal processor for a time between 30–60 seconds to form products including the intermetallic layer and a gaseous product, wherein:
the gas includes titanium tetrachloride and a diluent selected from a group consisting of hydrogen, argon, nitrogen, helium, and chlorine, wherein the titanium tetrachloride comprises less than 25 percent of the gas;
the substrate is at a temperature is at a temperature in a range of 300–450 degrees Celsius during the step of reacting; and
the intermetallic layer includes titanium aluminide and has a thickness no thicker than 1000 angstroms.

20. A process for forming an intermetallic layer including titanium aluminide over a semiconductor substrate comprising the steps of:
forming an aluminum-containing layer over the substrate; and
reacting the aluminum-containing layer with a gas at a pressure no higher than 500 millitorr in a rapid thermal processor for a time between 30–60 seconds to form the intermetallic layer having a thickness no thicker than 1000 angstroms, wherein:
the gas includes titanium tetrachloride and a diluent selected from a group consisting of hydrogen, argon, nitrogen, helium, and chlorine, wherein the titanium tetrachloride comprises less than 25 volume percent of the gas;
the substrate is at a temperature in a range of 300–450 degrees Celsius; and
the step of reacting occurs as a solid-gas reaction.

21. A process for forming an intermetallic layer including titanium aluminide over a semiconductor substrate comprising the steps of:
depositing an aluminum-containing layer over a first insulating layer, wherein:
the aluminum-containing layer includes at least 95 weight percent aluminum and an impurity selected from a group consisting of silicon and copper; and
the first insulating layer lies over the substrate;
patterning the aluminum-containing layer to form an interconnect;
reacting the interconnect with a gas at a pressure no higher than 500 millitorr in a rapid thermal processor for a time between 30–60 seconds to form the intermetallic layer having a thickness no thicker than 1000 angstroms, wherein:
the gas includes titanium tetrachloride and a diluent selected from a group consisting of hydrogen, argon, helium, and nitrogen, wherein the titanium tetrachloride comprises no more than 25 volume percent of the gas;
the substrate is at a temperature in a range of 300–450 degrees Celsius during the step of reacting; and
the step of reacting occurs as a solid-gas reaction.

22. A process for forming an intermetallic layer over a semiconductor substrate comprising the steps of:
forming a first layer over the substrate, wherein the first layer includes a first metal;
forming a patterned insulating layer including an opening over the first layer prior to reacting the first layer to form the intermetallic layer, wherein a portion of the first layer is exposed and underlies the opening; and reacting the exposed portion of the first layer with a gas to form products including the intermetallic layer and a gaseous product, wherein the gas includes a second metal that is different from the first metal, and wherein the substrate is at a temperature no higher than 700 degrees Celsius during the step of reacting.

23. The process of claim 22, wherein:

the step of reacting forms products consisting of the intermetallic layer and at least one other product;

the other product is a gas during the step of reacting;

the first and intermetallic layers are solids; and the step of reacting occurs as a solid-gas reaction.

24. The process of claim 22, wherein:

the first metal is aluminum and the first layer includes at least 95 percent aluminum;

the intermetallic layer includes titanium aluminide and the second metal is titanium;

the substrate is at a temperature no higher than 550 degrees Celsius during the step of reacting;

the step of reacting is performed in a piece of equipment selected from a group consisting of a furnace, a rapid thermal processor, a plasma etcher, and a sputter deposition machine.

the step of reacting is performed at a pressure no higher than atmospheric pressure; and the gas further includes a diluent selected from a group consisting of hydrogen, argon, nitrogen, helium, and chlorine.

25. A process for forming an intermetallic layer including titanium aluminide over a semiconductor substrate comprising the steps of:

forming an aluminum-containing layer over the substrate; and patterning the aluminum-containing layer to form sides prior reacting the aluminum-containing layer with a gas to form the intermetallic layer; and reacting the aluminum-containing layer with a gas to form the intermetallic layer, wherein the gas includes a titanium source.

26. The process of claim 25, wherein the step of reacting is performed in a piece of equipment selected from a group consisting of a furnace, a rapid thermal processor, a plasma etcher, and a sputter deposition machine.

27. The process of claim 25, wherein the aluminum-containing layer includes at least 95 percent aluminum.

28. The process of claim 25, wherein:

the step of reacting is performed at a temperature no higher than 550 degrees Celsius;

the step of reacting is performed at a pressure no higher than atmospheric pressure; and the gas includes a titanium source and a diluent selected from a group consisting of hydrogen, argon, nitrogen, helium, and chlorine; and the step of reacting occurs as a solid-gas reaction.

29. The process of claim 28, wherein the titanium source is a material selected from a group consisting of titanium tetrachloride, a titanium-halide compound, and an organotitanium compound.

30. The process of claim 29, wherein:

the step of reacting is performed:

in a rapid thermal processor;

at a pressure no higher than 500 millitorr;

while the substrate is at a temperature in a range of 300–450 degrees Celsius; and for a time between 30–60 seconds;

the titanium source is titanium tetrachloride and comprises less than 25 volume percent of the gas; and the intermetallic layer has a thickness no thicker than 1000 angstroms.

31. A process for forming an intermetallic layer including titanium aluminide over a semiconductor substrate comprising the steps of:

forming an aluminum-containing layer over the substrate;

forming a patterned insulating layer including an opening over the aluminum-containing layer prior to reacting the aluminum-containing layer to form the intermetallic layer, wherein a portion of the aluminum-containing layer is exposed and underlies the opening; and reacting the portion of the aluminum-containing layer with a gas to form the intermetallic layer, wherein the gas includes a titanium source.

32. The process of claim 31, wherein the step of reacting is performed in a piece of equipment selected from a group consisting of a furnace, a rapid thermal processor, a plasma etcher, and a sputter deposition machine.

33. The process of claim 31, wherein the aluminum-containing layer includes at least 95 percent aluminum.

34. The process of claim 31, wherein:

the step of reacting is performed at a temperature no higher than 550 degrees Celsius;

the step of reacting is performed at a pressure no higher than atmospheric pressure; and the gas further includes a diluent selected from a group consisting of hydrogen, argon, nitrogen, helium, and chlorine; and the step of reacting occurs as a solid-gas reaction.

35. The process of claim 34, wherein the titanium source is a material selected from a group consisting of titanium tetrachloride, a titanium-halide compound, and an organotitanium compound.

36. The process of claim 35, wherein:

the step of reacting is performed:

in a rapid thermal processor;

at a pressure no higher than 500 millitorr;

while the substrate is at a temperature in a range of 300–450 degrees Celsius; and for a time between 30–60 seconds;

the titanium source is titanium tetrachloride and comprises less than 25 volume percent of the gas; and the intermetallic layer has a thickness no thicker than 1000 angstroms.

* * * * *